United States Patent
Hazelton et al.

(10) Patent No.: US 8,508,718 B2
(45) Date of Patent: *Aug. 13, 2013

(54) WAFER TABLE HAVING SENSOR FOR IMMERSION LITHOGRAPHY

(75) Inventors: Andrew J Hazelton, Tokyo (JP); Hiroaki Takaiwa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 251 days.

This patent is subject to a terminal disclaimer.

(21) Appl. No.: 12/318,122

(22) Filed: Dec. 22, 2008

(65) Prior Publication Data

US 2009/0109418 A1 Apr. 30, 2009

Related U.S. Application Data

(60) Continuation of application No. 11/606,913, filed on Dec. 1, 2006, now Pat. No. 7,486,380, which is a division of application No. 11/319,399, filed on Dec. 29, 2005, now Pat. No. 7,301,607, which is a continuation of application No. PCT/US2004/017452, filed on Jun. 2, 2004.

(60) Provisional application No. 60/485,868, filed on Jul. 8, 2003.

(51) Int. Cl.
*G03B 27/58* (2006.01)

(52) U.S. Cl.
USPC .......................................................... 355/72

(58) Field of Classification Search
USPC ................................................ 355/72, 53, 74
See application file for complete search history.

(56) References Cited

U.S. PATENT DOCUMENTS

| | | | |
|---|---|---|---|
| 4,346,164 A | 8/1982 | Tabarelli et al. |
| 4,358,198 A | 11/1982 | Moriyama et al. |
| 4,465,368 A | 8/1984 | Matsuura et al. |
| 4,480,910 A | 11/1984 | Takanashi et al. |
| 5,243,195 A | 9/1993 | Nishi |

(Continued)

FOREIGN PATENT DOCUMENTS

| | | | |
|---|---|---|---|
| DE | 221 563 A1 | 4/1985 |
| DE | 224 448 A1 | 7/1985 |

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Toan Ton
*Assistant Examiner* — Chia-how Michael Liu
(74) *Attorney, Agent, or Firm* — Oliff & Berridge, PLC

(57) ABSTRACT

Methods and apparatus allow a liquid to be substantially contained between a lens and a wafer table assembly of an immersion lithography system. According to one example, an exposure apparatus includes a lens and a wafer table assembly. The wafer table assembly has a top surface, and is arranged to support a wafer to be moved with respect to the lens as well as at least one component. The top surface of the wafer and the top surface of the component are each at substantially a same height as the top surface of the wafer table assembly. An overall top surface of the wafer table assembly which includes the top surface of the wafer, the top surface of the wafer table assembly, and the top surface of the at least one component is substantially planar.

29 Claims, 9 Drawing Sheets

(56) References Cited

U.S. PATENT DOCUMENTS

| | | |
|---|---|---|
| 5,528,118 A | 6/1996 | Lee |
| 5,610,683 A | 3/1997 | Takahashi |
| 5,623,853 A | 4/1997 | Novak et al. |
| 5,633,698 A | 5/1997 | Imai |
| 5,668,672 A | 9/1997 | Oomura |
| 5,689,377 A | 11/1997 | Takahashi |
| 5,715,039 A | 2/1998 | Fukuda et al. |
| 5,825,043 A | 10/1998 | Suwa |
| 5,835,275 A | 11/1998 | Takahashi et al. |
| 5,874,820 A | 2/1999 | Lee |
| 5,892,117 A | 4/1999 | Theriot |
| 5,985,495 A | 11/1999 | Okumura et al. |
| 6,078,380 A | 6/2000 | Taniguchi et al. |
| 6,801,301 B2 | 10/2004 | Miyajima et al. |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0157408 A1 | 8/2004 | Best et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0007569 A1 | 1/2005 | Streefkerk et al. |
| 2005/0007570 A1 | 1/2005 | Streefkerk et al. |
| 2005/0024609 A1 | 2/2005 | De Smit et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0078287 A1 | 4/2005 | Sengers et al. |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Zaal et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0264778 A1 | 12/2005 | Lof et al. |
| 2005/0270505 A1 | 12/2005 | Smith |
| 2006/0103832 A1 | 5/2006 | Hazelton et al. |
| 2006/0170891 A1 | 8/2006 | Nishinaga et al. |

FOREIGN PATENT DOCUMENTS

| | | |
|---|---|---|
| EP | 1 429 188 A2 | 6/2004 |
| EP | 1 486 828 A2 | 12/2004 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-7-220990 | 8/1995 |
| JP | A-8-166475 | 6/1996 |
| JP | A-8-171054 | 7/1996 |
| JP | A-8-316125 | 11/1996 |
| JP | A-8-330224 | 12/1996 |
| JP | A-8-334695 | 12/1996 |
| JP | A-10-3039 | 1/1998 |
| JP | A-10-20195 | 1/1998 |
| JP | A-10-154659 | 6/1998 |
| JP | A-10-303114 | 11/1998 |
| JP | A-10-340846 | 12/1998 |
| JP | A-11-176727 | 7/1999 |
| JP | A-11-260686 | 9/1999 |
| JP | A-2000-58436 | 2/2000 |
| JP | A-2004-207732 | 7/2004 |
| JP | A-2005-5707 | 1/2005 |
| JP | A-2005-19864 | 1/2005 |
| WO | WO 99/49504 | 9/1999 |
| WO | WO 02/091078 A1 | 11/2002 |
| WO | WO 03/077036 A1 | 9/2003 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |

| | | |
|---|---|---|
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3$^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages. (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Apr. 28, 2006 Office Action in U.S. Appl. No. 11/319,399.

Sep. 15, 2006 Office Action in U.S. Appl. No. 11/319,399.

Mar. 29, 2007 Notice of Allowance in U.S. Appl. No. 11/319,399.

Jul. 25, 2007 Notice of Allowance in U.S. Appl. No. 11/319,399.

Apr. 6, 2007 Office Action in U.S. Appl. No. 11/606,913.

Dec. 28, 2007 Office Action in U.S. Appl. No. 11/606,913.

Sep. 29, 2008 Notice of Allowance in U.S. Appl. No. 11/606,913.

Sep. 7, 2007 Supplemental European Search Report in European Application No. 04754129.7.

Jul. 14, 2005 International Search Report in Application No. PCT/US04/17452.

Apr. 20, 2010 Office Action in Japanese Application No. 2006-518633, with translation.

Mar. 4, 2010 Communication Pursuant to Article 94(3) in European Application No. 04754129.7.

Nov. 2, 2010 Communication Pursuant to Article 94(3) in European Application No. 04 754 129.7.

Sep. 15, 2010 Office Action in Taiwanese Application No. 093117615, with translation.

Oct. 26, 2010 Office Action in Japanese Application No. 2006-518633, with translation.

Jul. 27, 2010 Office Action in Japanese Application No. 2006-518633, with translation.

Dec. 12, 2011 Office Action issued in Taiwanese Application No. 093117615 (with English translation).

Dec. 12, 2011 Office Action issued in Taiwanese Application No. 100109479 (with English translation).

Dec. 22, 2012 Office Action issued in Taiwanese Application No. 100109479 (with English translation).

Oct. 2, 2012 Office Action issued in JP Application No. 2010-140980 (with English translation).

WAFER TABLE HAVING SENSOR FOR IMMERSION LITHOGRAPHY

CROSS-REFERENCE TO RELATED APPLICATIONS

This is a continuation of U.S. patent application Ser. No. 11/606,913 filed Dec. 1, 2006 (now U.S. Pat. No. 7,486,380), which is a divisional of U.S. patent application Ser. No. 11/319,399 filed Dec. 29, 2005 (now U.S. Pat. No. 7,301,607), which in turn is a continuation of International Application No. PCT/US2004/017452 filed Jun. 2, 2004, which claims priority to U.S. Provisional Patent Application No. 60/485,868 filed Jul. 8, 2003. The disclosures of these applications are incorporated herein by reference in their entireties.

BACKGROUND

The invention relates generally to semiconductor processing equipment. More particularly, the invention relates to methods and apparatus for enabling liquid in an immersion lithography system to effectively be contained between a surface of a lens and a plane that is moved relative to the lens.

For precision instruments such as photolithography machines that are used in semiconductor processing, factors that affect the performance, e.g., accuracy, of the precision instrument generally must be dealt with and, insofar as possible, eliminated. When the performance of a precision instrument such as an immersion lithography exposure system is adversely affected, products formed using the precision instrument may be improperly formed and, hence, function improperly.

In an immersion lithography system, a liquid is provided between a lens and the surface of a wafer in order to improve the imaging performance of the lens. The use of liquid allows a numerical aperture associated with the lens, i.e., an effective numerical aperture of the lens, to essentially be increased substantially without altering characteristics of the lens, since a liquid such as water generally has a refractive index that is greater than one. In general, a higher numerical aperture enables a sharper image to be formed on the wafer. As will be appreciated by those skilled in the art, a high refractive index liquid allows for a high numerical aperture of the lens because an effective numerical aperture of a lens system of an immersion lithography system is generally defined to be approximately equal to the sine of an angle of diffraction of light that passes through a lens and reflects off a surface multiplied by the refractive index of the liquid. Because the refractive index of the liquid is greater than one, the use of liquid allows the effective numerical aperture of the lens to be increased, thereby enabling the resolution associated with the lens to essentially be improved.

Within most conventional lithography systems, air is present between a lens and a surface that passes under the lens, e.g., the surface of a wafer. In such systems, the numerical aperture associated with the lens is often in the range of approximately 0.8 to 0.9. Increasing the numerical aperture of a lens to achieve an improved resolution is generally impractical, because the diameter of a lens generally must be increased, which adds significant difficulty to a lens manufacturing process. In addition, the numerical aperture of a lens in air is theoretically limited to one, and, in practice, is limited to being somewhat less than one. Hence, immersion lithography systems enable the effective numerical aperture of a lens to be increased substantially beyond what is possible with a lens in air.

FIG. 1 is a diagrammatic cross-sectional representation of a portion of an immersion lithography apparatus. An immersion lithography apparatus 100 includes a lens assembly 104 that is positioned over a wafer table 112 that supports a wafer 108. Wafer table 112 is arranged to be scanned or otherwise moved under lens assembly 104. A liquid 116, which may be water in a typical application that uses approximately 193 nanometers (nm) of radiation, is present in a gap between lens assembly 104 and wafer 108. In order to effectively prevent liquid 116 from leaking out from under lens assembly 104, i.e., to effectively laterally contain liquid 116 between lens assembly 104 and wafer 108, a retaining ring 120 may be positioned such that retaining ring 120 enables liquid 116 to remain between lens assembly 104 and wafer 108, and within an area defined by retaining ring 120.

While retaining ring 120 is generally effective in containing liquid 116 when lens assembly 104 is positioned such that a small gap between retaining ring 120 and a surface of wafer 108 is maintained, for a situation in which at least a part of retaining ring 120 is above wafer 108, liquid 116 may leak out from between lens assembly 104 and wafer 108. By way of example, when an edge of wafer 108 is to be patterned, lens assembly 104 may be substantially centered over the edge such that a portion of retaining ring 120 fails to maintain the small gap under the bottom surface of retaining ring 120, and liquid 116 is allowed to leak out from between lens assembly 104 and wafer 108. As shown in FIG. 2, when lens assembly 104 is positioned such that at least part of a bottom surface of retaining ring 120 is not in contact with wafer 108, liquid 116 may not be contained in an area defined by retaining ring 120 between lens assembly 104 and wafer 108.

In an immersion lithography apparatus, a wafer table may support sensors and other components, e.g., a reference flat that is used to calibrate automatic focusing operations. Such sensors and other components generally may be positioned beneath a lens at some point. That is, sensors and other components associated with a wafer table may be occasionally positioned beneath a lens during the course of operating the lens and the wafer table. While the use of a retaining ring may prevent liquid from leaking out of a gap between a lens assembly and the top surface of the wafer, liquid may leak out from between the lens assembly and top surfaces of sensors and other components when the lens assembly is positioned over the sensors or other components.

FIG. 3 is a block diagram representation of a wafer table that supports a sensor and a wafer holder that holds a wafer. A wafer table 312 supports a wafer holder 310 that is arranged to hold a wafer (not shown), a sensor 350, and an interferometer mirror 352. Sensor 350 may be used through a lens (not shown) with liquid (not shown) between the lens and sensor 350. However, liquid will often flow out of the gap between a lens (not shown) and sensor 350 particularly when an edge of sensor 350 is positioned substantially beneath a center of the lens. The effectiveness of sensor 350 may be compromised when sensor 350 is designed and calibrated to operate in a liquid, and there is insufficient liquid present between a lens (not shown) and sensor 350. Further, when liquid (not shown) flows out of the gap between a lens (not shown) and sensor 350, the liquid that flowed out of the gap is effectively lost such that when the lens is subsequently positioned over a wafer (not shown) supported by wafer holder 310, the amount of liquid between the lens and the wafer may not be sufficient to enable the effective numerical aperture of the lens to be as high as desired. Hence, when liquid is not successfully contained between a lens (not shown) and sensor 350 while sensor 350 is at least partially positioned under the lens, an overall lithography process that involves the lens and sensor 350 may be compromised.

Therefore, what is needed is a method and an apparatus for allowing liquid to be maintained in a relatively small gap defined between a surface of a lens and a surface of substantially any sensors or components that are supported by a wafer table. That is, what is desired is a system that is suitable for preventing liquid positioned between a lens and substantially any surface on a wafer table that is moved under the lens from leaking out from between the lens and the surface.

SUMMARY

The invention relates to a wafer table arrangement that is suitable for use in an immersion lithography system. According to one aspect of the invention, an exposure apparatus includes a lens and a wafer table assembly. The wafer table assembly has a top surface, and is arranged to support a wafer to be moved with respect to the lens as well as at least one component. The top surface of the wafer and the top surface of the component are each at substantially a same height as the top surface of the wafer table assembly. An overall top surface of the wafer table assembly that includes the top surface of the wafer, the top surface of the wafer table assembly, and the top surface of the at least one component is substantially planar.

In one embodiment, the component may be at least one of a reference flat, an aerial image sensor, a dose sensor, and a dose uniformity sensor. In another embodiment, the wafer table assembly is arranged to support a wafer holder that holds the wafer such that the top surface of the wafer is at substantially the same height as the top surface of the wafer table assembly.

A wafer table arrangement that is configured to enable surfaces that are to be viewed through a lens to form a relatively planar overall surface of substantially the same height facilitates an immersion lithography process. When substantially all elements carried on a wafer table have top surfaces that are substantially level with the top surface of the wafer table, and any gaps between the sides of the components and the sides of openings in the wafer table are relatively small, the overall top surface of a wafer table arrangement may traverse under a lens while a layer or a film of liquid is effectively maintained between a surface of the lens and the overall top surface. Hence, an immersion lithography process may be performed substantially without the integrity of the layer of liquid between the surface of the lens and the overall top surface of the wafer table arrangement being compromised by the loss of liquid from the layer of liquid between the surface of the lens and the overall top surface of the wafer table arrangement.

According to another aspect of the invention, an immersion lithography apparatus includes a lens that has a first surface and an associated effective numerical aperture. The apparatus also includes a liquid that is suitable for enhancing the effective numerical aperture of the lens, and a table arrangement. The table arrangement has a substantially flat top surface that opposes the first surface, and the liquid is arranged substantially between the substantially flat top surface and the first surface. The substantially flat top surface includes a top surface of an object to be scanned and a top surface of at least one sensor.

These and other advantages of the invention will become apparent upon reading the following detailed descriptions and studying the various figures of the drawings.

BRIEF DESCRIPTION OF THE DRAWINGS

The invention will be described in conjunction with the accompanying drawings of exemplary embodiments in which like reference numerals designate like elements and in which.

DETAILED DESCRIPTION OF EMBODIMENTS

In immersion lithography systems, a wafer surface must generally be viewed through a lens with a layer of liquid such as a relatively thin film of liquid between the lens and the wafer surface. Some components such as sensors and/or reference members may often be viewed through the lens with a layer of liquid between the lens and the surfaces of the components. Maintaining the layer of liquid in a gap between the lens and the surface of the wafer, even when the lens is arranged to view edge portions of the wafer, allows the immersion lithography system to operate substantially as desired. Similarly, maintaining the layer of liquid in a gap between the lens and the surface of components such as sensors and/or reference members also facilitates the efficient operation of the immersion lithography system.

By utilizing the wafer table arrangement, surfaces that are to be viewed through a lens and a top surface of the wafer table arrangement form a relatively planar, substantially uniform overall surface. When substantially all components associated with the wafer table arrangement have a surface that is substantially level with the top surface of a wafer and the top surface of a wafer table, and any gaps between the sides of the components and the sides of openings in the wafer table are relatively small, the overall top surface of the wafer table arrangement may traverse under a lens while a layer or a film of liquid is effectively maintained between a surface of the lens and the overall top surface. As a result, an immersion lithography process may be performed substantially without having the integrity of the layer of liquid, i.e., the layer of liquid between the surface of the lens and the overall top surface of the wafer table arrangement, compromised.

Figure 1:
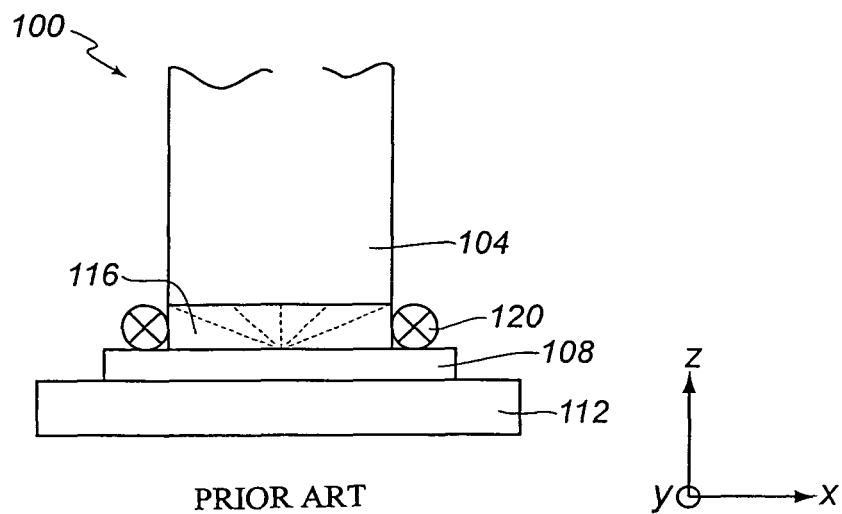
FIG. 1 is a diagrammatic cross-sectional representation of a portion of an immersion lithography apparatus in a first orientation.
Figure 2:
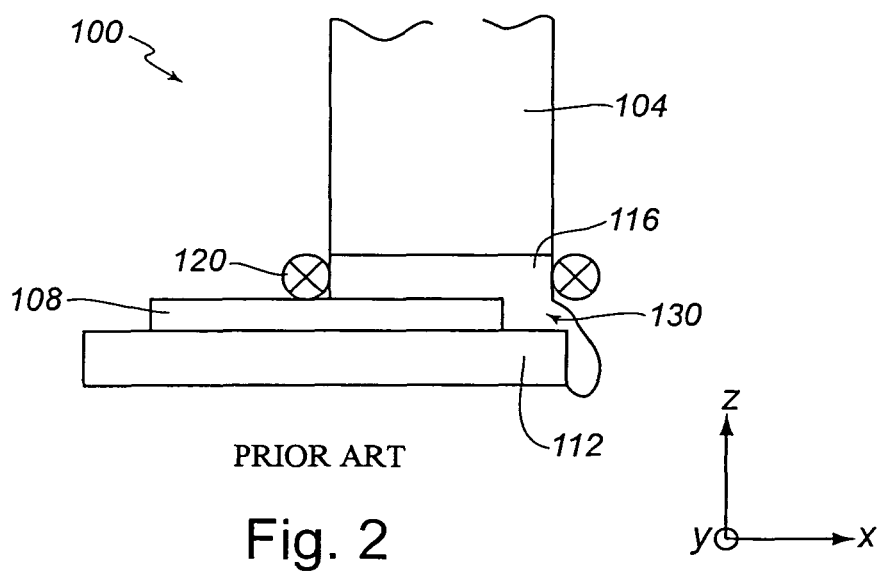
FIG. 2 is a diagrammatic cross-sectional representation of a portion of an immersion lithography apparatus, i.e., apparatus 100 of FIG. 1, in a second orientation.
Figure 3:
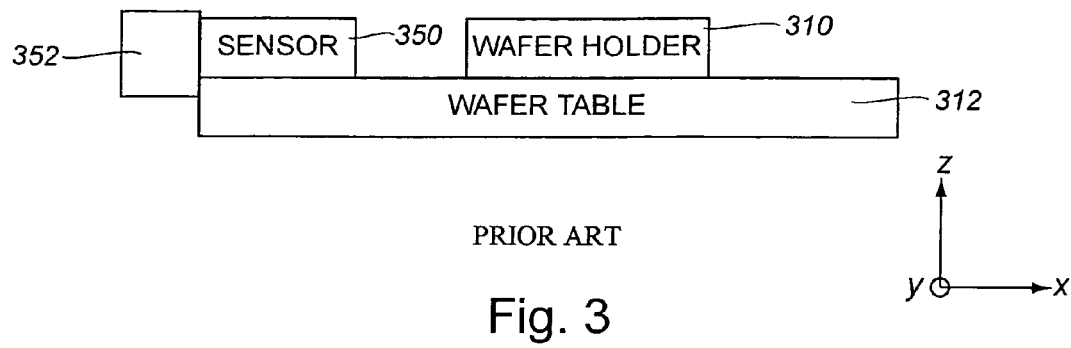
FIG. 3 is a block diagram representation of a wafer table that supports a sensor and a wafer holder that holds a wafer.
Figure 4:
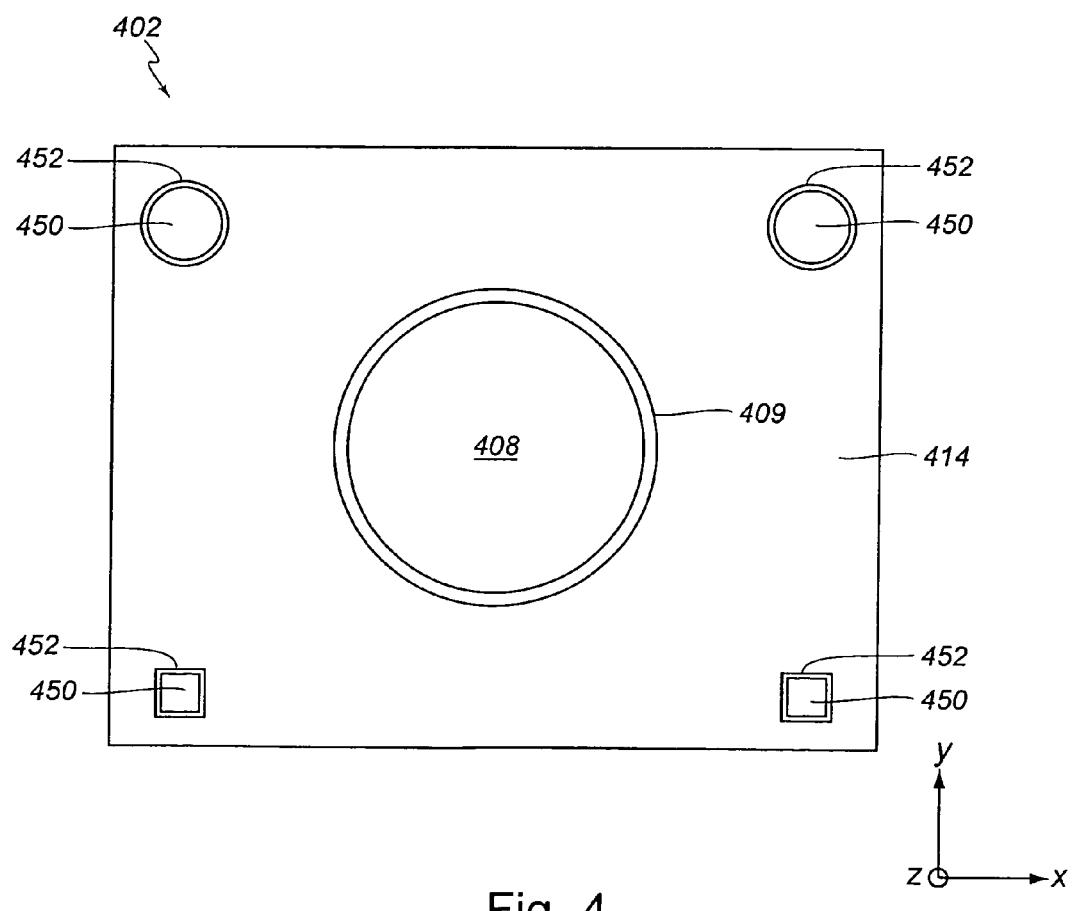
FIG. 4 is a block diagram representation of a top view of a wafer table assembly in accordance with an embodiment of the invention.

A wafer table that has a substantially raised, flat top surface of a uniform height allows a wafer and other components, e.g., sensors, to be installed such that a flat surface of the wafer and flat surfaces of the components are at substantially the same level or height as the raised, flat top surface of the wafer table. In one embodiment, an overall wafer table assembly includes openings within which a wafer, or a wafer holder on which the wafer is supported, and sensors may be positioned. FIG. 4 is a block diagram representation of a top view of a wafer table assembly in accordance with an embodiment of the invention. A wafer table assembly 402 includes openings 409, 452 that are sized to effectively house a wafer 408 and components 450, respectively, such that top surfaces of wafer 408 and components 450 are at substantially the same level as a top surface 414 of wafer table assembly 402. Typically, openings 409, 452 are sized to accommodate wafer 408 and components 450, respectively, such that a spacing between the outer edges of wafer 408 or components 450 and their respective openings 409, 452 is relatively small, e.g., between approximately ten and approximately 500 micrometers.

In general, the spacing between wafer 408, or in some cases, a wafer holder (not shown) and opening 409, as well as the spacing between components 450 and their corresponding openings 452 does not significantly affect the overall planar quality of an overall top surface of wafer table assembly 402. That is, an overall top surface of wafer table assembly 402 which includes top surface 414, the top surface of wafer 408, and the top surfaces of components 450 is substantially planar, with the planarity of the overall top surface being substantially unaffected by the presence of the small gaps between the sides of wafer 408 and opening 409, and the sides of components 450 and openings 452.

Figure 5:
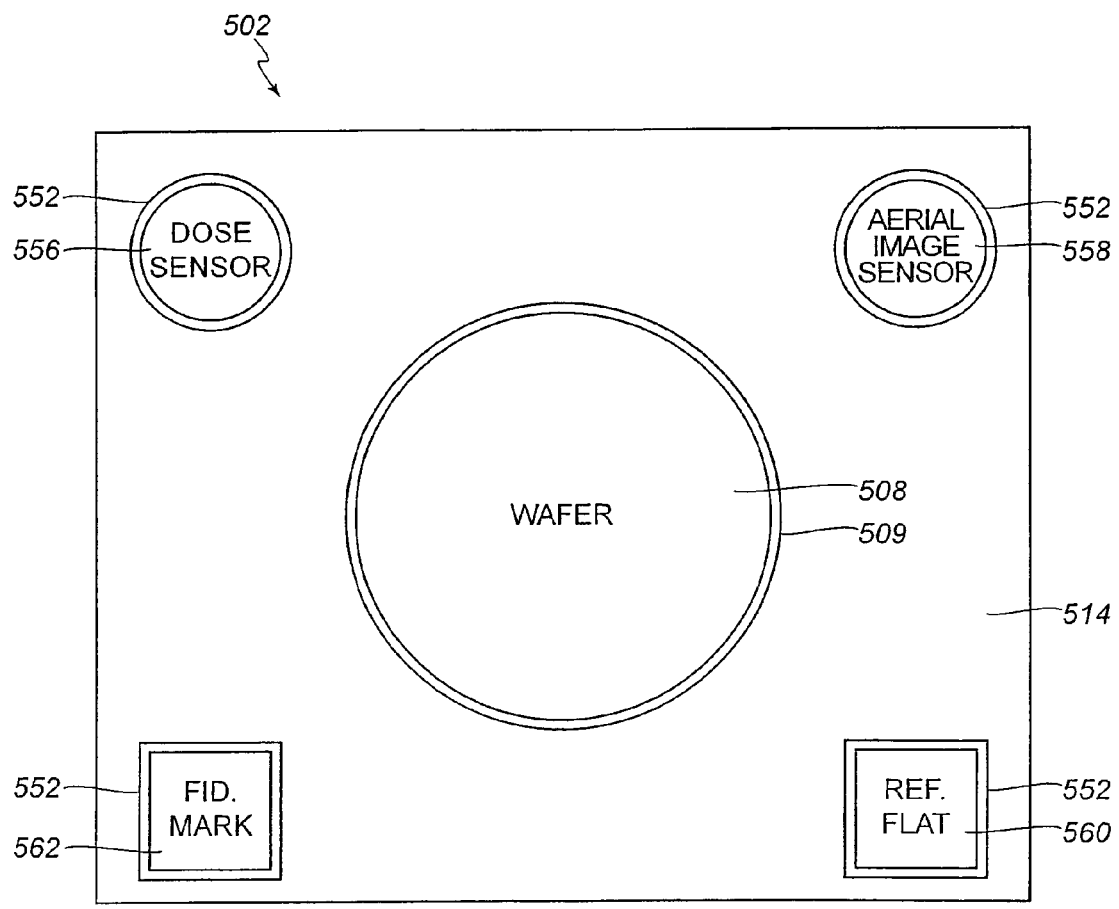
FIG. 5 is a block diagram representation of a top view of components that are supported by a wafer table assembly with a substantially uniform, planar overall top surface in accordance with an embodiment of the invention.
Figure 5:
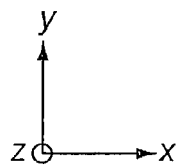

Components 450 may include, but are not limited to, various sensors and reference marks. With reference to FIG. 5, components that are supported by a wafer table assembly with a substantially uniform, planar overall top surface will be described in accordance with an embodiment of the invention. A wafer table assembly 502 includes a raised, substantially uniform top surface 514 in which openings 509, 552 are defined. Opening 509 is arranged to hold a wafer 508 which may be supported by a wafer holder (not shown). Openings 552 are arranged to support any number of components. In the described embodiment, openings 552 are arranged to support a dose sensor or a dose uniformity sensor 556, an aerial image sensor 558, a reference flat 560, and a fiducial mark 562, which each have top surfaces that are arranged to be of substantially the same height as top surface 514 such that an overall, substantially uniform, planar top surface is formed. Examples of a suitable dose sensor or dose uniformity sensor 556 are described in U.S. Pat. Nos. 4,465,368, 6,078,380, and U.S. Patent Publication No. 2002/0061469A1, which are each incorporated herein by reference in their entireties. An example of an aerial image sensor 558 is described in U.S. Patent Publication No. 2002/0041377A1, which is incorporated herein by reference in its entirety. An example of a reference flat 560 is described in U.S. Pat. No. 5,985,495, which is incorporated herein by reference in its entirety, while an example of a fiducial mark 562 is described in U.S. Pat. No. 5,243,195, which is incorporated herein by reference in its entirety.

It should be appreciated that openings 552 are sized to accommodate components such that gaps between the sides of components, as for example dose sensor or dose uniformity sensor 556, aerial image sensor 558, reference flat 560, and fiducial mark 562, and edges of openings 552 are not large enough to significantly affect the uniformity and planarity of the overall top surface. In other words, components are relatively tightly fit within openings 552.

Dose sensor or a dose uniformity sensor 556, one or both of which may be included in openings 552, is/are arranged to be used to determine a strength of a light source associated with a lens assembly (not shown) by studying light energy at the level of the top surface of wafer 508. In one embodiment, only a dose uniformity sensor is typically included. A dose sensor generally measures absolute illumination intensity, while a dose uniformity sensor typically measures variations over an area. As such, dose sensor or does uniformity sensor 556 is positioned in the same plane as the top surface of wafer 508. Aerial image sensor 558 is arranged to effectively measure an aerial image that is to be projected onto the surface of wafer 508 and, hence, exposed on photoresist. In order for aerial image sensor to accurately measure an aerial image, aerial image sensor 558 is essentially positioned at the same level or plane as the top surface of wafer 508.

Reference flat 560 is generally used to calibrate the automatic focus functionality of a lens assembly (not shown), while fiducial mark 562 is a pattern that is used to enable wafer 508 to be aligned with respect to the lens assembly and reticle, as will be understood by those skilled in the art. Both reference flat 560 and fiducial mark 562 are positioned in the same plane as wafer 508.

Figure 6A:
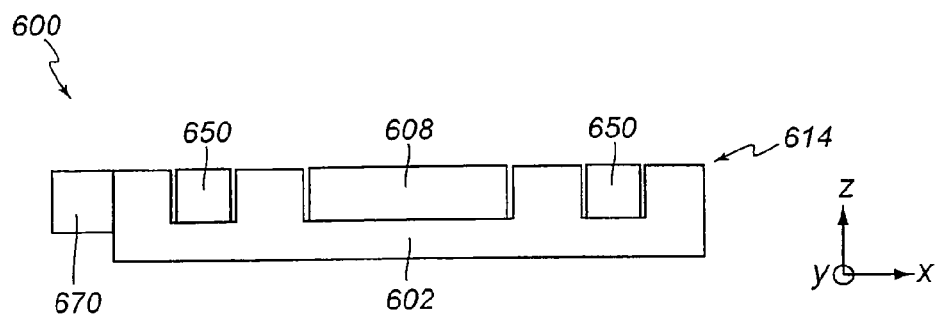
FIG. 6a is a diagrammatic cross-sectional representation of a wafer table assembly that has a substantially uniform, planar overall top surface in accordance with an embodiment of the invention.

FIG. 6a is a diagrammatic cross-sectional representation of a wafer table assembly that has a substantially uniform, planar overall top surface in accordance with an embodiment of the invention. An overall wafer table assembly 600 includes a wafer table 602 that is arranged to support a wafer holder 608 that holds a wafer (not shown) such that a top surface of the wafer is substantially flush with an overall top surface 614 of wafer table assembly 600. Wafer table 602 also supports components 650, which may include sensors and reference marks, such that top surfaces of components 650 are also substantially flush with overall top surface 614, as discussed above. In other words, top surfaces of components 650, wafer holder 608 when supporting a wafer (not shown), and wafer table 602 effectively form a substantially flat overall top surface 614 of relatively uniform height. Wafer holder 608 and components 650 are arranged to be relatively tightly fit into openings defined within wafer table 602 such that a gap between the side of wafer holder 608 and the sides of an associated opening within wafer table 602, as well as gaps between components 650 and the sides of associated openings within wafer table 602, are each relatively small, and do not have a significant effect on the uniformity of overall top surface 614.

Wafer table 602 may support additional components or elements in addition to wafer holder 608, a wafer (not shown), and components 650. By way of example, wafer table 602 may support an interferometer mirror 670. It should be appreciated that a top surface of interferometer mirror 670 may also be substantially level with overall top surface 614. Hence, in one embodiment, overall top surface 614 may include interferometer mirror 670.

Figure 6B:
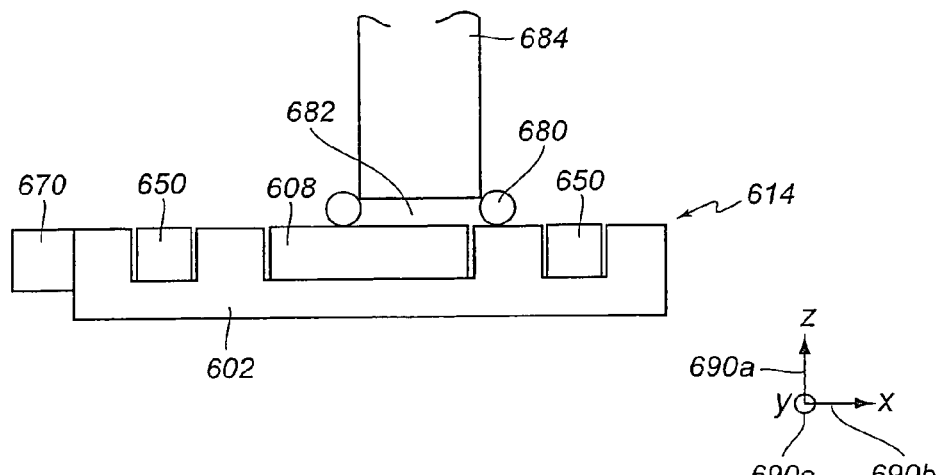
FIG. 6b is a diagrammatic representation of a wafer table assembly, e.g., wafer table assembly 600 of FIG. 6a, with a lens assembly positioned over a wafer holder in accordance with an embodiment of the invention.

Overall top surface 614 enables liquid to be maintained in a gap between a lens assembly and overall top surface 614 when a component 650 or wafer holder 608 traverses beneath the lens. FIG. 6b is a diagrammatic representation of a wafer table assembly, e.g., wafer table assembly 600 of FIG. 6a, that is arranged to scan beneath a lens assembly in accordance with an embodiment of the invention. A lens assembly 684, which is arranged to be positioned over overall top surface 614 is effectively separated from overall top surface 614 along a z-axis 690a by a layer of liquid 682. The size of the immersion area covered by liquid 682 is relatively small, e.g., the size of the immersion area may be smaller than that of the wafer (not shown). Local fill methods that are used to provide the liquid of the immersion area are described in PCT International Patent Application No. PCT/US04/10055 (filed Mar. 29, 2004), PCT International Patent Application No. PCT/US04/09994 (filed Apr. 1, 2004), and PCT International Patent Application No. PCT/US04/10071 (filed Apr. 1, 2004), which are each incorporated herein by reference in their entireties. Layer of liquid 682 is effectively held between overall top surface 614 and lens assembly 684 with respect to an x-axis 690b and a y-axis 690c by a retaining ring 680, although substantially any suitable arrangement may be used to effectively hold layer of liquid 682 in place relative to x-axis 690b and y-axis 690c. Retaining ring 680 is arranged as a ring-like structure with respect to x-axis 690b and y-axis 690c which contains liquid 682 in an area defined by the edges of retaining ring 680. That is, retaining ring 680 forms a ring-like shape about z-axis 690a.

In another embodiment, retaining ring 680 may not be necessary. If the gap between lens assembly 684 and overall top surface 614 (or wafer surface) is relatively small, e.g., between approximately 0.5 mm and approximately 5 mm, layer of liquid 682 may be effectively held in the gap with surface tension of liquid 682.

In general, liquid 682 may be substantially any suitable liquid that fills a gap or a space between a surface of lens assembly 684 and overall top surface 614 within an area defined by retaining ring 680 that allows an effective numerical aperture of a lens included in lens assembly 684 to be increased for the same wavelength of light and the same physical size of the lens. Liquids including various oils, e.g., Fomblin™ oil, may be suitable for use as liquid 682. In one embodiment, as for example within an overall system that uses approximately 193 nanometers (nm) of radiation, liquid 682 is water. However, for shorter wavelengths, liquid 682 may be an oil.

Figure 6C:
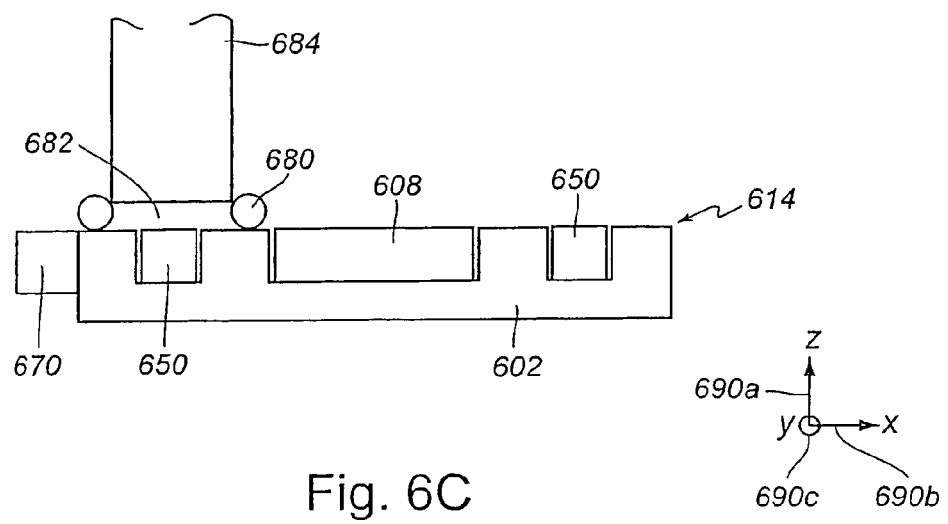
FIG. 6c is a diagrammatic representation of a wafer table assembly, e.g., wafer table assembly 600 of FIG. 6a, with a lens assembly positioned over a component in accordance with an embodiment of the invention.

Because overall top surface 614 is substantially flat and uniform, when lens assembly 684 is positioned over wafer holder 608, liquid 682 does not leak out from between overall top surface 614 and lens assembly 684, because retaining ring 680 remains in contact or in close proximity with overall top surface 614, even when lens assembly 684 is positioned over an edge of wafer holder 608. The uniformity and planarity of overall top surface 614 also allows liquid 682 to remain between lens assembly 684 and overall top surface 614 when lens assembly 684 is oriented over a component 650, as shown in FIG. 6c.

While a wafer table arrangement may include a wafer table in which openings have been defined to house a wafer or a wafer holder and any number of components, a wafer table arrangement may instead include a wafer table that has no openings to house a wafer or a wafer holder and any number of components and structures that may cooperate with the wafer table to effectively form openings in which a wafer or a wafer holder and any number of components may be placed. In other words, a substantially planar wafer table arrangement may either include openings formed within a wafer table as discussed above, or openings defined by a structure or structures positioned atop a wafer table.

Figure 10A:
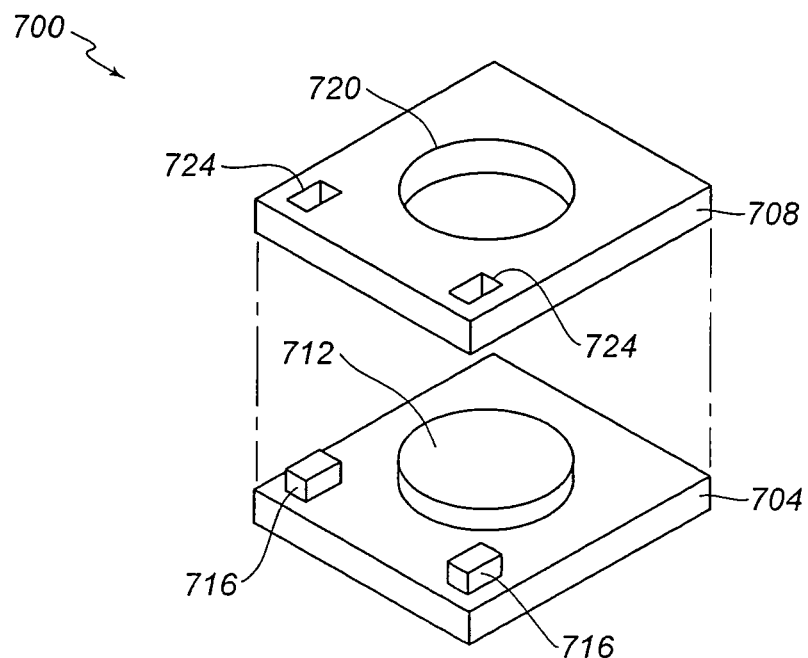
FIG. 10a is a diagrammatic representation of a wafer table surface plate and a wafer table in accordance with an embodiment of the invention.

When a wafer table arrangement includes a structure that defines openings that may effectively house a wafer and components and provides a substantially planar top surface for the wafer table arrangement, the structure may generally be a plate-like structure within which openings are formed. With reference to FIG. 10a, a wafer table arrangement that includes a wafer table and a wafer table surface plate will be described in accordance with an embodiment of the invention. A wafer table arrangement 700 includes a wafer table 704 and a wafer table surface plate 708. Wafer table 704 supports a wafer 712 and one or more components 716 which may include various sensors, a fiducial mark, or a reference flat. Wafer table surface plate 708, which may be formed from any suitable material, e.g., Teflon, includes an opening 720 within which wafer 712 may be positioned when wafer table surface plate 708 is positioned atop wafer table 704. Openings 724, which are also defined in wafer table surface plate 708, are arranged to fit around components 716 when wafer table surface plate 708 is positioned atop wafer table 704.

Figure 10B:
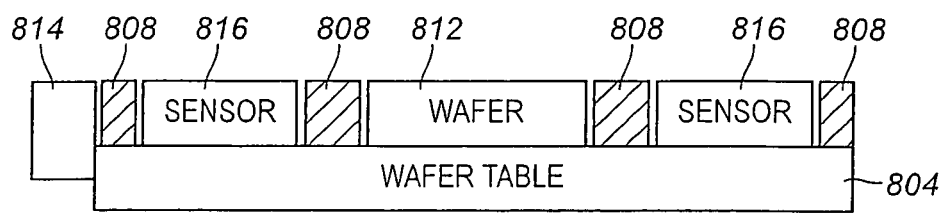
FIG. 10b is a diagrammatic cross-sectional representation of a wafer table assembly that includes a wafer table and a wafer table surface plate in accordance with an embodiment of the invention.

Wafer table surface plate 708 includes a top surface which, when wafer table surface plate 708 is positioned atop wafer table 704 such that wafer 712 is positioned within opening 720 and components 716 are positioned within openings 724, cooperates with a top surface of wafer 712 and top surfaces of components 716 to create a substantially uniform, planar overall top surface. As shown in FIG. 10b, when a wafer table surface plate 808 is positioned over a wafer table 804, a top surface of components 816, e.g., sensors, and a top surface of a wafer 812 are at substantially the same height as a top surface of wafer table surface plate 808. In the embodiment as shown, an interferometer mirror 814 also has a top surface that is at substantially the same height as the top surface of wafer table surface plate 808. Hence, an overall wafer table arrangement that includes wafer table 804 and wafer table surface plate 808 has an overall top surface that is relatively uniform and planar.

While a wafer table arrangement may include a wafer table in which openings have been defined to house a wafer or a wafer holder and any number of components, a wafer table arrangement may instead include a wafer table that has no openings to house a wafer or a wafer holder and any number of components and structures that may cooperate with the wafer table to effectively form openings in which a wafer or a wafer holder and any number of components may be placed. In other words, a substantially planar wafer table arrangement may either include openings formed within a wafer table as discussed above, or openings defined by a structure or structures positioned atop a wafer table.

Figure 11A:
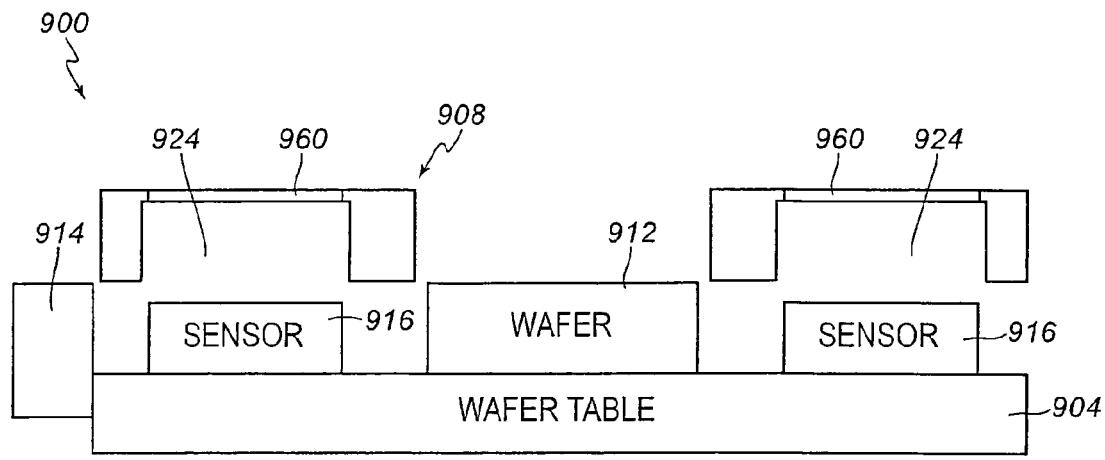
FIG. 11a is a diagrammatic cross-sectional representation of a wafer table and a wafer table surface plate with windows in accordance with an embodiment of the invention.
Figure 11B:
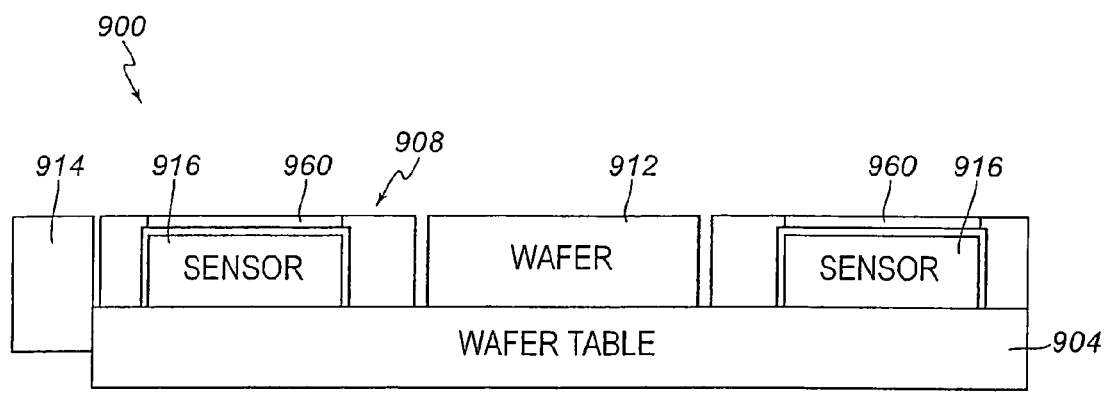
FIG. 11b is a diagrammatic cross-sectional representation of a wafer table assembly that includes a wafer table and a wafer table surface plate with windows, i.e., wafer table 904 and wafer table surface plate 908 of FIG. 11a, in accordance with an embodiment of the invention.

A plate-like structure that enables a substantially planar overall surface of a wafer table arrangement to be achieved may vary widely. In one embodiment, sensors or components may be integral to the plate-like structure. By way of example, a reference flat or a fiducial mark may be etched or otherwise formed directly onto the plate-like structure. In another embodiment, the plate-like structure may include an opening within which a wafer supported by a wafer holder may be held, and openings topped by windows that may protect sensors while allowing sensors to function. With reference to FIGS. 11a and 11b, a wafer table arrangement that includes a wafer table and a wafer table surface plate with windows will be described in accordance with an embodiment of the invention. A wafer table arrangement 900 includes a wafer table 904 and a wafer table surface plate 908 that includes windows 960 that are arranged to be positioned over one or more components 916 such as sensors, as shown in FIG. 11b. Wafer table 904 supports a wafer 912, which is arranged to fit into an opening in plate 908.

Plate 908 may be formed from any suitable material, e.g., Teflon, with windows 960 being formed from a clear material. Alternatively, plate 908 may be a clear cover plate with windows 960 being relatively thin portions of plate 908 positioned over openings 924 that are arranged to fit around components 916 when wafer table surface plate 908 is positioned atop wafer table 904. A top surface of plate 908 cooperates with a top surface of wafer 912 to form a substantially planar top surface for arrangement 900. As with the other embodiments, an interferometer mirror 914 also may be provided.

Figure 7:
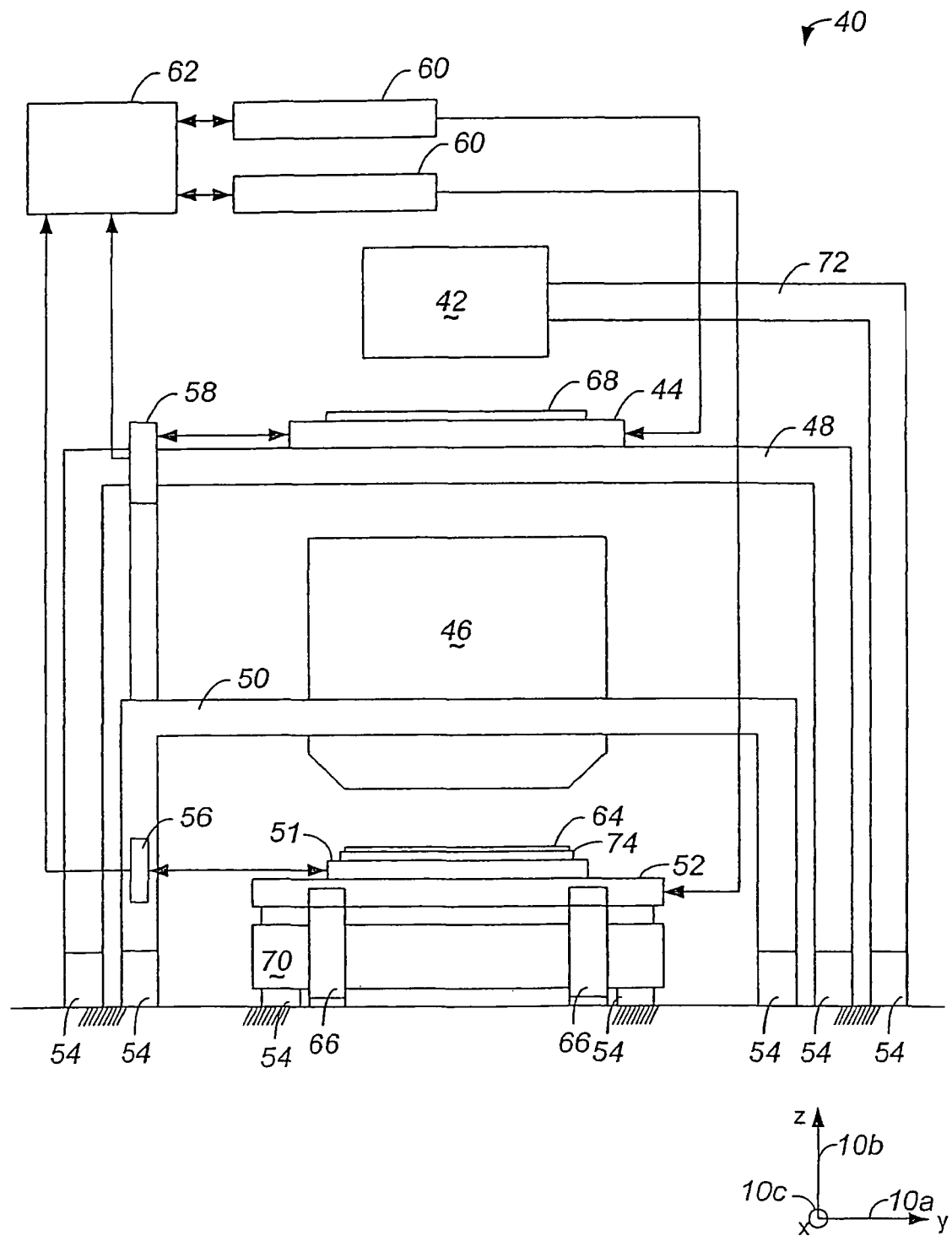
FIG. 7 is a diagrammatic representation of a photolithography apparatus in accordance with an embodiment of the invention.

With reference to FIG. 7, a photolithography apparatus that may be part of an immersion lithography exposure system that includes a wafer table assembly with a flat surface of substantially uniform height will be described in accordance with an embodiment of the invention. A photolithography apparatus (exposure apparatus) 40 includes a wafer positioning stage 52 that may be driven by a planar motor (not shown), as well as a wafer table 51 that is magnetically coupled to wafer positioning stage 52 by utilizing an EI-core actuator, e.g., an EI-core actuator with a top coil and a bottom coil that are substantially independently controlled. The planar motor that drives wafer positioning stage 52 generally uses an electromagnetic force generated by magnets and corresponding armature coils arranged in two dimensions. A wafer 64 is held in place on a wafer holder or chuck 74 that is coupled to wafer table 51. Wafer positioning stage 52 is arranged to move in multiple degrees of freedom, e.g., between three to six degrees of freedom, under the control of a control unit 60 and a system controller 62. In one embodiment, wafer positioning stage 52 may include a plurality of actuators that are coupled to a common magnet track. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In the described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, and is arranged to project a radiant energy, e.g., light, through a mask pattern on a reticle 68 that is supported by and scanned using a reticle stage 44 that includes a coarse stage and a fine stage, and that is supported on frame 48. The radiant energy is focused through projection optical system 46, which is supported on a projection optics frame 50 and may be supported by the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper that reduces vibrations associated with wafer table 51 such that interferometer 56 may accurately detect the position of wafer table 51. A second interferometer 58 is supported on projection optical system 46, and detects the position of reticle stage 44 which supports a reticle 68. Interferometer 58 also outputs position information to system controller 62.

It should be appreciated that there are a number of different types of photolithographic apparatus or devices. For example, photolithography apparatus 40, or an exposure apparatus, may be used as a scanning type photolithography system that exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head. The illumination source of illumination system 42 may be g-line (436 nanometers (nm)), i-line (365 nm), a KrF excimer laser (248 nm), an ArF excimer laser (193 nm), or an $F_2$-type laser (157 nm).

With respect to projection optical system 46, when far ultraviolet rays such as an excimer laser is used, glass materials such as quartz and fluorite that transmit far ultraviolet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultraviolet (VUV) radiation of a wavelength that is approximately 200 nm or lower, use of a catadioptric type optical system may be considered. Examples of a catadioptric type of optical system include, but are not limited to, those described in Japanese Laid-Open Patent Application No. 8-171054 and its counterpart U.S. Pat. No. 5,668,672, as well as in Japanese Laid-Open Patent Application No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japanese Laid-Open Patent Application No. 8-334695 and its counterpart U.S. Pat. No. 5,689,377, as well as Japanese Laid-Open Patent Application No. 10-3039 and its counterpart U.S. Pat. No. 5,892,117, which are all incorporated herein by reference in their entireties. These examples describe a reflecting-refracting type of optical system that incorporates a concave minor, but without a beam splitter, and may also be suitable for use with the invention.

Further, in photolithography systems, when linear motors (see U.S. Pat. No. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage that uses no guide.

Alternatively, a wafer stage or a reticle stage may be driven by a planar motor that drives a stage through the use of electromagnetic forces generated by a magnet unit that has magnets arranged in two dimensions and an armature coil unit that has coils in facing positions in two dimensions. With this type of drive system, one of the magnet unit or the armature coil unit is connected to the stage, while the other is mounted on the moving plane side of the stage.

Movement of the stages as described above generates reaction forces that may affect performance of an overall photolithography system. Reaction forces generated by the wafer (substrate) stage motion may be mechanically released to the floor or ground by use of a frame member as described above, as well as in U.S. Pat. No. 5,528,118 and Japanese Laid-Open Patent Application No. 8-166475. Additionally, reaction forces generated by the reticle (mask) stage motion may be mechanically released to the floor (ground) by use of a frame member as described in U.S. Pat. No. 5,874,820 and Japanese Laid-Open Patent Application No. 8-330224, which are each incorporated herein by reference in their entireties.

Isolators such as isolators 54 may generally be associated with an active vibration isolation system (AVIS). An AVIS generally controls vibrations associated with forces, i.e., vibrational forces, that are experienced by a stage assembly or, more generally, by a photolithography machine such as photolithography apparatus 40 that includes a stage assembly.

A photolithography system according to the above-described embodiments, e.g., a photolithography apparatus that may include one or more dual force actuators, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 8:
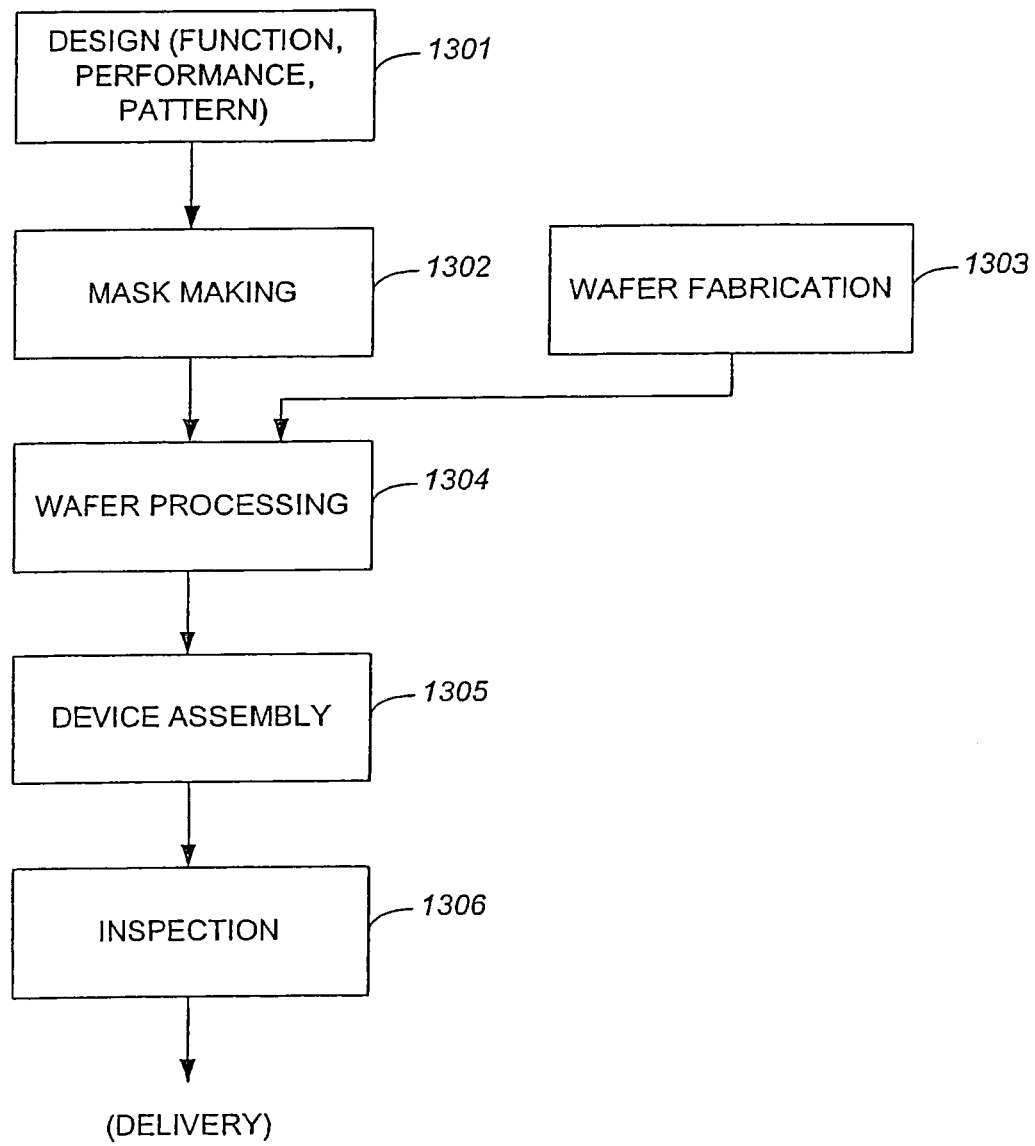
FIG. 8 is a process flow diagram that illustrates the steps associated with fabricating a semiconductor device in accordance with an embodiment of the invention.

Further, semiconductor devices may be fabricated using systems described above, as will be discussed with reference to FIG. 8. The process begins at step 1301 in which the function and performance characteristics of a semiconductor device are designed or otherwise determined. Next, in step 1302, a reticle (mask) that has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 9. In step 1305, the semiconductor device is assembled. The assembly of the semiconductor device generally includes, but is not limited to, wafer dicing processes, bonding processes, and packaging processes. Finally, the completed device is inspected in step 1306.

Figure 9:
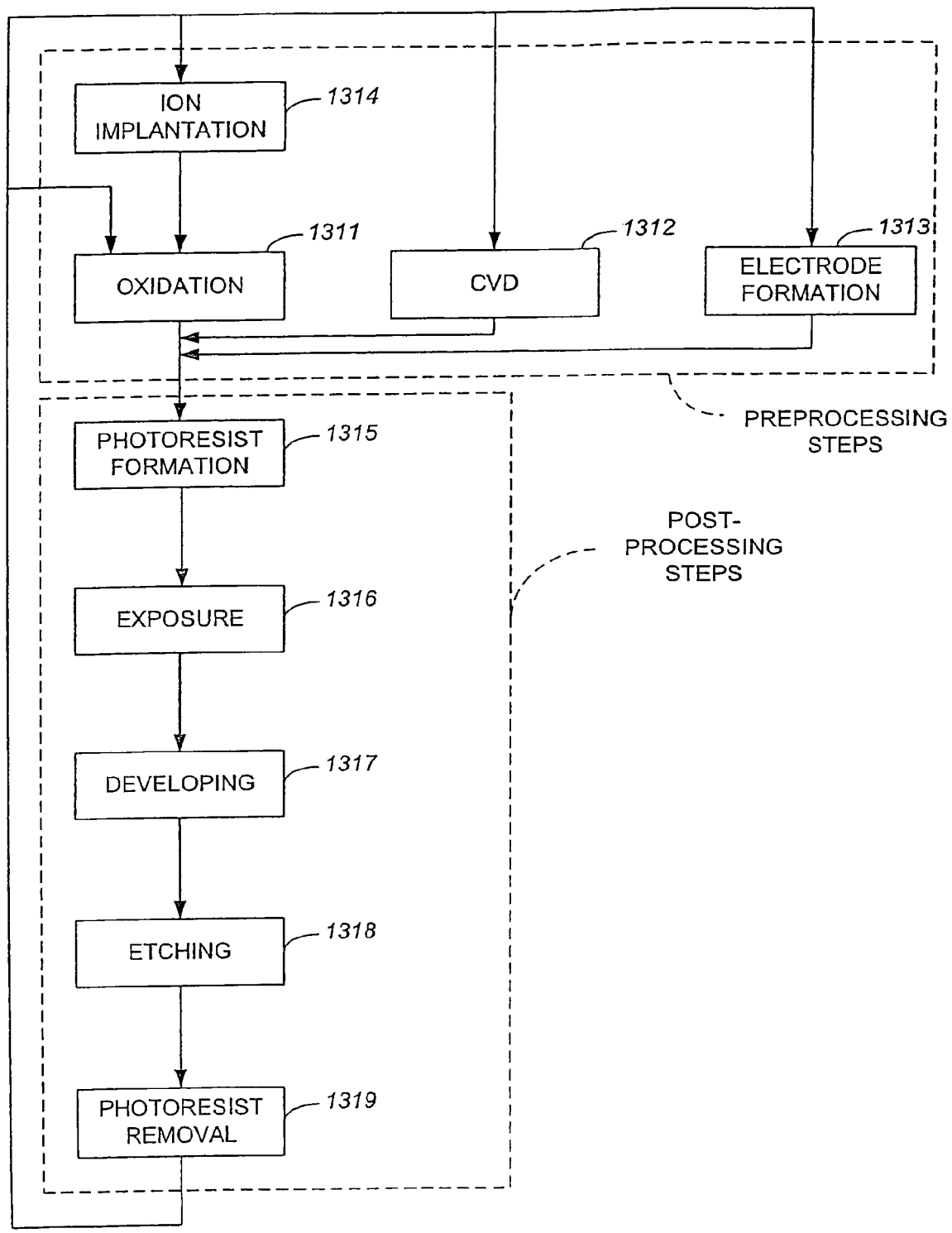
FIG. 9 is a process flow diagram that illustrates the steps associated with processing a wafer, i.e., step 1304 of FIG. 8, in accordance with an embodiment of the invention.

FIG. 9 is a process flow diagram that illustrates the steps associated with wafer processing in the case of fabricating semiconductor devices in accordance with an embodiment of the invention. In step 1311, the surface of a wafer is oxidized. Then, in step 1312, which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311-1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle to the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching in step 1318. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the invention have been described, it should be understood that the invention may be embodied in many other specific forms without departing from the spirit or the scope of the invention. By way of example, although the use of a wafer table arrangement with a substantially flat overall planar surface of a uniform height has been described as being suitable for use in an immersion lithography system to enable a small liquid-filled or fluid-filled gap to be maintained between a projection lens and the surface of the wafer table, such a wafer table is not limited to use as a part of an immersion lithography system.

A table that supports an object to be scanned and has a relatively planar, substantially uniform top surface has generally been described as being a wafer table. Such a table is not limited to being a wafer table. For instance, a reticle table may also have a relatively planar, substantially uniform top surface. Alternatively, a substrate table supporting, for example, a glass plate for LCD manufacturing, a microscope specimen, or the like may also have a substantially flat planar surface.

Components that are supported within a wafer table arrangement such that top surfaces of the components are at substantially the same height as a top surface of a wafer table have been described as including dose sensors, dose uniformity sensors, aerial image sensors, reference flats, and fiducial marks. It should be appreciated, however, that any suitable additional components may be supported within the wafer table arrangement such that the top surfaces of the additional components are substantially flush with the top surface of the wafer table. Further, while a wafer table arrangement may include a dose sensor or a dose uniformity sensor, an aerial image sensor, a reference flat, and a fiducial mark, a wafer table arrangement may not necessarily include a dose sensor or a dose uniformity sensor, an aerial image sensor, a reference flat, and a fiducial mark. That is, a wafer table arrangement may include as little as one component that has a top surface that is substantially flush with the overall top surface of the wafer table arrangement.

It should be appreciated that for substantially all components supported on a wafer table to have top surfaces that are substantially flush with the overall top surface of the a wafer table arrangement, the wafer table arrangement may need to support a bottom surface of each component at different heights. That is, the bottom surfaces of the components may need to be supported at different heights in order to enable the top surfaces of the components to be oriented such that the top surfaces are all substantially flush with the overall top surface of the wafer table arrangement.

The materials used to form a wafer table arrangement, e.g., a wafer table and a plate that is positioned atop the wafer table, may be widely varied. Although a plate has been described as being formed from Teflon, it should be appreciated that the plate may be formed from substantially any suitable material. Therefore, the present examples are to be considered as illustrative and not restrictive, and the invention is not to be limited to the details given herein, but may be modified.

What is claimed is:

1. A liquid immersion exposure apparatus which exposes a substrate with light via a projection optical system and a liquid, the apparatus comprising:
   a liquid containment member arranged around an optical path of the light emitted from the projection optical system, and which forms an immersion area with the liquid under the projection optical system;
   a table assembly having a holder which holds the substrate, and a top surface in which an opening is formed, the holder is arranged in the opening, a surface of the substrate held by the holder is positionable opposite to the projection optical system by the table assembly and is contactable with the liquid of the immersion area;
   a detecting system having a transparent member which is detachably provided on the table assembly, and a detector which detects the light via the transparent member; wherein
   a top surface of the transparent member and the top surface of the table assembly are substantially co-planar,
   the transparent member is positionable under the projection optical system by the table assembly, and
   the detector detects the light via the projection optical system, the liquid of the immersion area, and the transparent member, the top surface of which contacts the liquid of the immersion area, positioned under the projection optical system.

2. The liquid immersion exposure apparatus according to claim 1, wherein the surface of the substrate held by the holder and the top surface of the table assembly are substantially co-planar.

3. The liquid immersion exposure apparatus according to claim 2, wherein
   a different opening from the opening is formed in the top surface of the table assembly,
   the transparent member is arranged in the different opening such that the top surface of the transparent member and the top surface of the table assembly are substantially co-planar, and
   the detector detects the light via the transparent member arranged in the different opening.

4. The liquid immersion exposure apparatus according to claim 3, wherein
   the transparent member is arranged to be fitted in the different opening.

5. The liquid immersion exposure apparatus according to claim 1, further comprising:
   a reference mark member provided on the table assembly, the reference mark member having a surface, wherein
   the surface of the reference mark member and the top surface of the table assembly are substantially co-planar.

6. The liquid immersion exposure apparatus according to claim 1, wherein
   the table assembly includes a member which has a surface that is detachably provided on the table assembly,
   the top surface of the table assembly includes the surface of the member, and
   the surface of the member and the top surface of the transparent member are substantially co-planar.

7. The liquid immersion exposure apparatus according to claim 6, wherein the surface of the substrate held by the holder and the surface of the member are substantially co-planar.

8. The liquid immersion exposure apparatus according to claim 7, wherein
   a different opening from the opening is formed in the surface of the member,
   the transparent member is arranged in the different opening such that the top surface of the transparent member and the surface of the member are substantially co-planar, and
   the detector detects the light via the transparent member arranged in the different opening.

9. The liquid immersion exposure apparatus according to claim 8, wherein
   the transparent member is arranged to be fitted in the different opening.

10. A device manufacturing method comprising a lithography process, wherein the lithography process uses the liquid immersion exposure apparatus according to claim 1.

11. The liquid immersion exposure apparatus according to claim 1, wherein
the immersion area is maintained by the substrate held by the holder, the top surface of the table assembly or both.

12. The liquid immersion exposure apparatus according to claim 1, wherein
the immersion area is maintained by a part of the surface of the substrate positioned under the projection optical system.

13. The liquid immersion exposure apparatus according to claim 1, wherein
the holder holds the substrate so that a gap exists between an edge of the substrate and an edge of the opening.

14. The liquid immersion exposure apparatus according to claim 1, wherein
the detecting system has a plurality of transparent members including the transparent member and a plurality of detectors including the detector,
each top surface of the plurality of transparent members and the top surface of the table assembly are substantially co-planar,
each of the plurality of transparent members is positionable under the projection optical system by the table assembly, and
the plurality of detectors detect the light via the plurality of transparent members, respectively, the top surface of which contacts the liquid of the immersion area, positioned under the projection optical system.

15. The liquid immersion exposure apparatus according to claim 14, wherein
the plurality of transparent members are respectively arranged at corners of the table assembly, which are different from each other.

16. The liquid immersion exposure apparatus according to claim 1, wherein
the detecting system measures an intensity of the light.

17. The liquid immersion exposure apparatus according to claim 1, wherein
the detector detects an aerial image of a pattern illuminated with the light.

18. The liquid immersion exposure apparatus according to claim 1, further comprising:
a mask stage that supports a mask on which a pattern is formed, wherein
by movement of the table assembly and the mask stage, a scanning exposure for the substrate with the pattern is executed.

19. A liquid immersion exposure method of exposing a substrate with light via a projection optical system and a liquid, the method comprising:
holding the substrate with a holder of a table assembly, the holder being arranged in an opening which is formed in a top surface of the table assembly, the table assembly having a transparent member which is detachably provided on the table assembly such that a top surface of the transparent member and the top surface of the table assembly are substantially co-planar;
moving the table assembly relative to the projection optical system such that the transparent member is positioned under an immersion area, the immersion area being formed with the liquid under the projection optical system by a liquid containment member which is arranged around an optical path of the light emitted from the projection optical system, and the top surface of the transparent member contacting the liquid of the immersion area; and
detecting the light with a detector via the projection optical system, the liquid of the immersion area and the transparent member; wherein
a surface of the substrate held by the holder is positioned opposite to the projection optical system by the table assembly, and contacts the liquid of the immersion area.

20. The liquid immersion exposure method according to claim 19, wherein the surface of the substrate held by the holder and the top surface of the table assembly are substantially co-planar.

21. The liquid immersion exposure method according to claim 20, wherein
a different opening from the opening is formed in the top surface of the table assembly,
the transparent member is arranged in the different opening such that the top surface of the transparent member and the top surface of the table assembly are substantially co-planar, and
the detector detects the light via the transparent member arranged in the different opening.

22. The liquid immersion exposure method according to claim 19, wherein
the table assembly includes a member that is detachably provided on the table assembly, and
the top surface of the table assembly includes a surface of the member, and the surface of the member and the top surface of the transparent member are substantially co-planar.

23. The liquid immersion exposure method according to claim 22, wherein the surface of the substrate held by the holder and the top surface of the member are substantially co-planar.

24. The liquid immersion exposure method according to claim 22, wherein
a different opening from the opening is formed in the surface of the member,
the transparent member is arranged in the different opening such that the top surface of the transparent member and the surface of the member are substantially co-planar, and
the detector detects the light via the transparent member arranged in the different opening.

25. A device manufacturing method comprising a lithography process, wherein the lithography process uses the liquid immersion exposure method according to claim 19.

26. The liquid immersion exposure method according to claim. 19, wherein
the immersion area is maintained by the substrate held by the holder, the top surface of the table assembly or both.

27. The liquid immersion exposure method according to claim 19, wherein
the immersion area is maintained by a part of the surface of the substrate positioned under the projection optical system.

28. The liquid immersion exposure method according to claim 19, further comprising:
supporting a mask on which a pattern is formed with a mask stage, wherein
by movement of the table assembly and the mask stage, a scanning exposure for the substrate with the pattern is executed.

29. A method of making a liquid immersion exposure apparatus, the method comprising:

providing a liquid containment member arranged around an optical path of light emitted from a projection optical system of the liquid immersion exposure apparatus, and which forms an immersion area with liquid under the projection optical system;

providing a table assembly having a holder which holds the substrate, and a top surface in which an opening is formed, the holder is arranged in the opening, a surface of the substrate held by the holder is positionable opposite to the projection optical system by the table assembly and is contactable with the liquid of the immersion area; and providing a detecting system having a transparent member which is detachably provided on the table assembly, and a detector which detects the light via the transparent member; wherein a top surface of the transparent member and the top surface of the table assembly are substantially co-planar, the transparent member is positionable under the projection optical system by the table assembly, and the detector detects the light via the projection optical system, the liquid of the immersion area, and the transparent member, the top surface of which contacts the liquid of the immersion area, positioned under the projection optical system.

* * * * *